Figure 3:
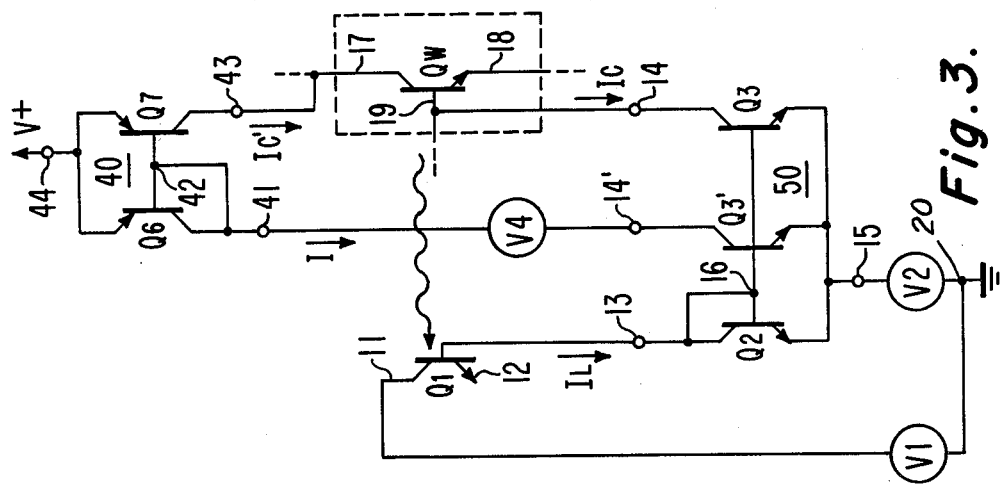

United States Patent [19]

Leidich

[11] 4,216,394
[45] Aug. 5, 1980

[54] LEAKAGE CURRENT COMPENSATION CIRCUIT

[75] Inventor: Arthur J. Leidich, Flemington, N.J.

[73] Assignee: RCA Corporation, New York, N.Y.

[21] Appl. No.: 919,068

[22] Filed: Jun. 26, 1978

[51] Int. Cl.² .......................... H03K 1/02; H03K 1/04
[52] U.S. Cl. ............................... 307/296 R; 307/303; 307/310; 330/296
[58] Field of Search ............... 307/237, 303, 296, 310; 330/288, 296

[56] References Cited

U.S. PATENT DOCUMENTS

| | | | |
|---|---|---|---|
| 3,409,839 | 11/1968 | Crowe | 330/296 X |
| 3,716,727 | 2/1973 | Stehlin et al. | 307/243 |
| 3,873,905 | 3/1975 | Marek | 307/326 X |
| 3,942,129 | 3/1976 | Hall | 330/288 X |
| 4,068,254 | 1/1978 | Erdi | 330/288 X |

Primary Examiner—John Zazworsky
Attorney, Agent, or Firm—Paul J. Rasmussen; Allen LeRoy Limberg; Allan J. Jacobson

[57] ABSTRACT

A current mirror receives as input current the leakage current through an auxiliary semiconductor pn junction, which leakage current emulates the leakage current of a similar semiconductor pn junction in a bipolar transistor used in the functional portion of the integrated circuit. The resulting output current of the current mirror is applied to counteract the effect of the leakage current.

5 Claims, 3 Drawing Figures

LEAKAGE CURRENT COMPENSATION CIRCUIT

This invention relates to electrical circuits in which the effect of leakage current through a semiconductor junction in a bipolar transistor is counteracted.

Certain types of electrical circuits such as precision amplifiers and micropower devices are significantly affected by minor in-circuit leakage currents which would be insignificant in a typical operational amplifier. For illustrative purposes consider a ramp generator comprised of a bipolar transistor current source charging a capacitor load with its collector current, the charge integrated by the capacitor creating a linearly increasing potential between its plates. The bipolar transistor supplying the charging current has its base-collector junction reverse biased by a potential which changes linearly with the capacitor potential. Nominally a small leakage current (nanoamperes) will be conducted across the collector-base junction, and the amplitude of that leakage current will be a function of both reverse bias potential and temperature.

If the base electrode of the transistor is biased from a high impedance source, leakage current flowing across its reverse-biased collector-base junction flows on through its base-emitter junction and will then be multiplied by the forward current gain of the transistor. So, the collector current will be increased by an amount one or two orders of magnitude greater than the actual leakage current. If the collector current is in the order of milliamperes, this increase in collector current is generally insignificant. But, if the charging current is in the order of microamperes, the effective leakage may be of the same order as the charging current and significantly contribute to non-linearites in the desired output characteristic.

As another example, consider micropower circuits which employ high impedance loads to limit quiescent currents within the circuit and minimize power dissipated. Additional currents, due to leakage, especially when multiplied by a transistor forward current gain, flowing through said loads cause a quiescent potential drop which either limits dynamic range or offsets the points where saturation occurs. The leakage is compounded by temperature changes and as is well known in the art, pn junction leakage current approximately doubles for every 10° C. rise in temperature. Whereas a fixed leakage current is readily compensated for and a steady state ac leakage current can be nulled on average, it is difficult to compensate for dynamic changes in leakage current resulting from temperature changes.

Compensation of leakage currents, while difficult in discretely wired circuits, is practical on integrated circuits where the entire circuit is fabricated on a single monolithic die. Due to the small size of the typical monolithic die the elements are coupled thermally, and similar elements generally have closely matched electrical characteristics. These two factors make possible the generation of similar leakage currents in auxiliary circuits on the die, which currents can then be applied to counteract undesirable leakage currents.

Counteracting the effect of a leakage current from a workpiece element upon a critical node in the circuit can be achieved by generating a like current and applying the generated current to that node to increase or decrease the current amplitude at that node to the value it would have if it were not diminished or enlarged by said leakage current. Similar leakage currents can be generated by subjecting an auxiliary circuit element, physically similar to the workpiece element exhibiting the unwanted leakage current, to bias and thermal conditions similar to those on the workpiece element to generate a leakage current proportional to that generated by the workpiece element. On a monolithic die similar thermal conditions are established by locating the auxiliary element in relatively close proximity to the workpiece element. Similar bias conditions can be established by including the auxiliary element in a circuit similar to the circuit in which said workpiece element is operating or by connecting the auxiliary element with potential generating means, in such manner to impose substantially similar bias conditions.

In the present invention a current mirror amplifier responds to leakage current supplied to its input circuit from an auxiliary pn junction to apply a compensating current from its output circuit, to the critical node in the circuit, which would otherwise be adversely affected by leakage current across one of the junctions of a bipolar transistor. The relatively low impedance offered by the input circuit of the current mirror amplifier permits its serial connection with the auxiliary pn junction to sense leakage current therethrough, without interfering with the imposition of bias potential on the auxiliary element to cause it to pass leakage current. The relatively high output impedance offered by the output circuit of the current mirror amplifier facilitates the application of the compensating current to the critical node in the circuit without changing the potential thereat. The substantially invariant current gain offered by the current mirror amplifiers guarantees matching between the leakage current through the auxiliary pn junction and the compensating current, despite changes in temperature.

Figure 2:
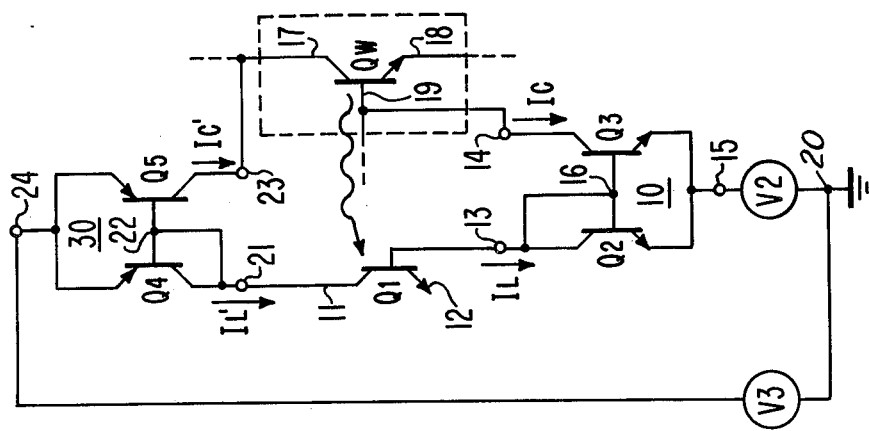
Figure 1:
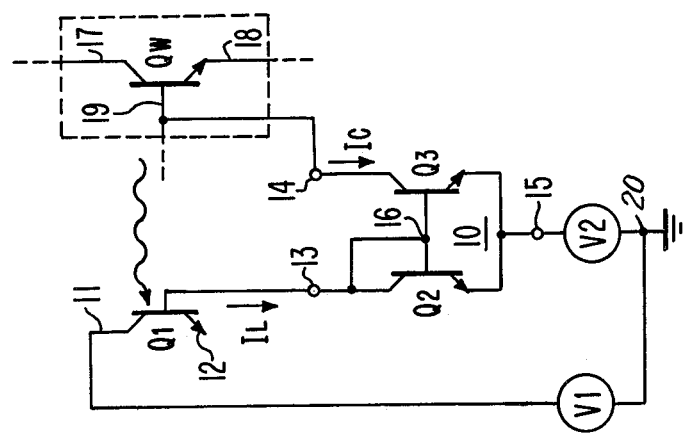

In the drawings:

FIGS. 1, 2 and 3 are schematic diagrams of respective embodiments of the invention for counteracting the collector-to-base pn junction leakage currents of bipolar transistors.

Referring to FIG. 1, transistor Qw is a transistor which is an integral part of a larger functional circuit and which has an undesirable leakage current from its collector-to-base electrodes. This leakage current, which would add to the base current of Qw, is diverted by the collector current Ic of transistor Q3, and prevented from providing increased base current drive to Qw.

Transistor Q1 is an auxiliary circuit element the collector-base pn junction of which is employed to generate a leakage current $I_L$. Q1 has a profile similar to that of Qw and is proximate to Qw to insure close thermal coupling with Qw (which coupling is indicated by the wavy arrow between Qw and Q1). The emitter-base junction of Q1 is not forward-biased, so there is no base current flow to Q1 associated with supporting emitter current flow. This may be achieved by leaving the emitter electrode of Q1 unconnected or by connecting the emitter electrode of Q1 to its base electrode, by way of examples. Alternatively, the transistor Q1 may be fabricated without an emitter diffusion at all, which condition would have no appreciable, effect on the collector-to-base leakage current. In order that Q1 produces a leakage current which exhibits the same percentage with temperature as exhibited by the leakage current of Qw, a bias condition is established across the collector-base junction of Q1 by potential means V1 and V2 which is the same as the bias condition across the collector-base junction of Qw. In the circuit of FIG. 1 the collector-base potential $V_{CB}$ of Q1 is $V_1-V_2-V_{BE}$, where $V_1$ and $V_2$ are respectively the voltages of potential generating means V1 and V2 and $V_{BE}$ is the base-emitter offset potential of transistor Q2.

Master transistor Q2 and slave transistor Q3 form current mirror 10 having an input terminal 13, an output terminal 14 and a common terminal 15. Current mirror 10 responsive to current $I_L$ applied to its input terminal 13 provides an output current at terminal 14 which is linearly related to the input current by a gain factor (—G) which gain factor is established by the ratio of the base-emitter junction areas of transistors Q2 and Q3. Input current to input terminal 13, a portion of which flows via the collector-base feedback connection of Q2 through the base-emitter junction of Q2, conditions the collector-emitter path of Q2 to conduct the input current and establishes a potential at the base of Q2 commensurate with the current being conducted. Q3 similar to Q2 in all respects, save in some instances for the base-emitter junction area, conducts responsive to the potential generated at the base electrode of Q2 applied by means of the common base interconnection between Q2 and Q3. The output current Ic at terminal 14 is the integral of the base-emitter current density of Q3 over the area of the base-emitter junction. The base-emitter current density of Q3 and Q2 are similar as a result of similar profiles and the same applied base-emitter potential, causing the relationships of the Q2-Q3 emitter currents and their collector currents to be directly proportional to their emitter areas.

The input terminal 13 of current mirror 10 is arranged in series with the auxiliary leakage path, the base-collector junction of Q1 in FIG. 1, to receive the auxiliary leakage current $I_L$, which current mirrored at terminal 14 can be applied to the base electrode of the workpiece transistor Qw whose leakage is to be counteracted. In such an arrangement the output current $I_c$ from terminal 14 is the negative of the leakage current appearing at the base of the workpiece transistor and their sum nulls to zero.

The fact that a current mirror can exhibit a range of current gains adds flexibility to the means for generating compensation current. The auxiliary junction area and the bias potential across said junction can be decreased or increased with compensating changes in current mirror gain.

The current mirror output exhibits a relatively high impedance tending to allow application of the output current to any relatively low impedance circuit points without affecting the operation of the circuit.

It is important to note that the collector-base junction of current mirror transistor Q3 is also susceptible of generating leakage currents. The collector-base junction of Q2 normally is not susceptible of leakage due to its collector-base electrode interconnection establishing zero potential across its collector-base junction, denying it an electric field to support conduction. The leakage at Q3 can be compensated by accounting for it in determining the gain factor, G, of the current mirror 10.

Alternatively, the collector-base leakage of Q3 may be eliminated by conditioning the collector-to-base potential of Q3 to be zero, by suitable adjustment of the voltage $V_2$ provided by potential generating means V2. This in fact is the reason one includes the potential generating means V2 in the circuit. For example, if the potential at the base electrode 19 of Qw is $V_{19}$ the value of $V_2$ is chosen so that $V_2 = V_{19} - V_{BE}$, $V_{BE}$ being the base-emitter potential of Q2 or Q3. This causes the potential at 16 to equal that at 19 so the collector-to-base potential of Q3 is zero-valued. In the particular case where the emitter electrode 18 of Qw is returned to reference potential 20, $V_{19}$ equals the base-emitter offset potential $V_{BE}$ and V2 can be replaced by direct connection without substantial intervening impedance.

The problem of leakage currents arising within the current mirror 10 can also be eliminated by the use of metal-oxide- semiconductor or MOS transistors as mirroring transistors where the technology permits. (RCA Corporation's BiMOS process is an example of such technology.) MOS transistors do not support leakage current between their gate or control electrodes and their output or drain electrodes. In addition, the use of properly designed MOS transistors results in a current mirror amplifier having a current gain unaffected by the potential appearing between its common and output terminals, permitting the common terminal of the current mirror amplifier to be connected directly to ground rather than through potential generating means V2.

Potential generating means $V_1$ is typically a dc voltage supply. It can have a relatively high output impedance because its only function is to support current into the relatively higher output impedance of the collector electrode 11 of Q1. For example, V1 may be a string of series connected diodes or resistors or a combination of both connected between a supply potential and reference, and with voltage tapped from the series connection at the appropriate point to yield the requisite amplitude. Alternatively, V1 may provide a dynamic signal to emulate closely the variations of potential appearing at the collector electrode 17 of Qw in which case V1 may simulate the circuit driving the workpiece Qw.

Potential generating means V2, on the other hand, is preferably a relatively low output impedance voltage supply. By way of examples, it may be provided by a path through one or more forward-biased diodes or may be provided by the output of a transistor voltage regulator.

The circuit of FIG. 2 shows an embodiment of the invention wherein compensating leakage currents Ic and Ic' of opposite polarities are provided to counteract the effects of leakage current at both the collector and the base electrodes of the workpiece transistor Qw. Transistors Q4 and Q5 operating respectively as master and slave mirror transistors form a current mirror 30 having input terminal 21, output terminal 23 and common terminal 24. Current mirror 30, complementary in conductivity to current mirror 10 has an input circuit between its common and input terminals which input circuit is interposed between potential generating means V3 and the collector electrode 11 of auxiliary transistor Q1.

The leakage current $I_L'$ flowing through the collector-base junction of Q1 flows through the input circuit of current mirror 30, provides an output current Ic' from its output terminal 23 which is linearly related to the input current. Output current Ic' is applied at the collector electrode 17 of workpiece Qw to replace current lost to leakage while current Ic applied to the base 19 of Qw diverts current augmented by leakage. Leakage current $I_L'$ is essentially equal in value to leakage current $I_L$.

$I_L'$ may, however, have additional leakage current components depending upon the particular structure. If the collector material abuts the array semiconductor substrate it forms a further pn junction capable of supporting leakage current. Similar conditions would exist between both the auxiliary device and the workpiece. Therefore the compensating current Ic' would also be correspondingly larger or smaller than Ic in the same ratio as $I_L'$ is larger or smaller to $I_L$. The design constraints on current mirror 30 are similar to those of current mirror 10. Potential generating means V3 is similar to V1 but is required to have an additional dc component to compensate for the base-emitter offset potential $V_{BE}$ of Q4.

FIG. 3 shows an embodiment wherein leakage current from auxiliary transistor Q1 is applied to current mirror 50, which current mirror has first and second outputs 14 and 14'. Current mirror 50, having slave transistor Q3, outputs compensating current Ic which is linearly related to input current $I_L$ and which is applied to the base electrode 19 of workpiece transistor Qw to counteract the effects of leakage current appearing at that node. Current mirror 50 has a further slave transistor Q3' which outputs current I at terminal 14'. Output current I is proportional to current $I_L$ and is applied to the input terminal 41 of current mirror 40. Current mirror 40 responsive to I flowing in its input circuit generates current Ic' at its output terminal 43 which is applied to collector electrode 17 of the workpiece transistor Qw to counteract the loss of current due to leakage at that node. In this circuit current mirror 40 inverts the polarity of current flow which appears at the output 14' of current mirror 50.

Potential generating means V1 and V2 perform like functions to their counterparts in the circuit of FIG. 1. Potential means V4 is included to reduce the collector-base potential of transistor Q3' and thereby decrease its collector-base leakage current. Potential means V4 may be realized by a string of series connected diodes between terminals 41 and 14', which diodes chosen n in number and type, i.e. rectifying, avalanche, schottky etc., and poled so as to produce the requisite offset potential.

Further compensating currents for application to further workpiece devices operating under similar conditions to Qw are producible by adding additional slave transistors to current mirror 10 in the circuit of FIG. 1 or current mirrors 10 or 30 in the circuit of FIG. 2 and similarly for current mirrors 40 and 50 in the circuit of FIG. 3. The output current of each of the additional slave transistors may be proportional to the input current by any desired fraction through appropriate choice of ratios of the effective area of its emitter-base junction to that of the master mirror transistor.

While the foregoing has described the means for compensating bipolar leakage currents in terms of collector-base leakage, the same means may be employed to compensate emitter-base reverse leakage current and collector-emitter leakage current.

What I claim is:

1. In an electrical circuit including a workpiece bipolar transistor having first and second electrodes with a reverse-biased semiconductor pn junction therebetween, which workpiece pn junction tends to exhibit a leakage current, leakage current compensating means for diverting said leakage currents to itself and from other portions of said electrical circuit, which leakage current compensating means comprises:

an auxiliary semiconductor pn junction having a similar profile to said workpiece pn junction, having first and second electrodes and being located to be subject to similar thermal conditions as said workpiece pn junction;

potential bias means for establishing a reverse bias potential across said auxiliary junction having a quiescent value substantially the same as that of the reverse bias operating potential across said workpiece pn junction, responsive to which an auxiliary leakage current will tend to flow through said auxillary junction; and first current mirror means having an input terminal which connects to the first electrode of said auxiliary pn junction for receiving the leakage current flowing through the first electrode of said auxiliary semiconductor pn junction and having at least a first output terminal which connects to the first electrode of said workpiece bipolar transistor, said current mirror means responsive to the auxiliary leakage current flowing through its input terminal to conduct via its output terminal leakage current flowing through the first electrode of said workpiece bipolar transistor to avoid its being conducted by said other portions of said electrical circuit.

2. An electrical circuit with leakage current compensating means as set forth in claim 1 wherein said leakage current compensating means further includes:

a second current mirror means having an input terminal which connects to the second electrode of said auxiliary pn junction and having an output terminal which connects to the second electrode of said workpiece bipolar transistor, said second current mirror means being of a conductivity type for receiving the leakage current flowing through the second electrode of said auxiliary semiconductor pn junction and being responsive to the auxiliary leakage current flowing through its input terminal to conduct via its output terminal leakage current flowing through the second electrode of said workpiece bipolar transistor to avoid its being conducted by said other portions of said electrical circuit.

3. An electrical circuit with leakage current compensating means as set forth in claim 1 or 2 wherein said workpiece bipolar transistor has base and collector electrodes corresponding to its first and second electrodes, respectively, and has a collector-base junction corresponding to said workpiece pn junction.

4. An electrical circuit with leakage current compensating means as set forth in claim 1 wherein said workpiece bipolar transistor has collector and base electrodes corresponding to its first and second electrodes, respectively, and has a collector-base junction corresponding to said workpiece pn junction.

5. An electrical circuit with leakage current compensating means as set forth in claim 1 wherein the first current mirror means in said leakage current compensating means has a second output terminal and wherein said leakage current compensating means further includes:

a second current mirror means having an input terminal to which the second output terminal of said first current mirror means connects, being of a conductivity type complementary to said first current mirror means, and having an output terminal connected to the second electrode of said workpiece bipolar transistor.

* * * * *

UNITED STATES PATENT AND TRADEMARK OFFICE
CERTIFICATE OF CORRECTION

PATENT NO. : 4216394

DATED : August 5, 1980

INVENTOR(S): Arthur John Leidich

It is certified that error appears in the above-identified patent and that said Letters Patent is hereby corrected as shown below:

In Column 2, line 64, after percentage insert
--change--

Signed and Sealed this

Twenty-eighth Day of October 1980

[SEAL]

Attest:

SIDNEY A. DIAMOND

Attesting Officer

Commissioner of Patents and Trademarks